(12) United States Patent
An et al.

(10) Patent No.: US 9,915,550 B2
(45) Date of Patent: Mar. 13, 2018

(54) METHOD AND APPARATUS FOR DATA FUSION OF A THREE-AXIS MAGNETOMETER AND THREE AXIS ACCELEROMETER

(71) Applicant: Memsic, Inc., Andover, MA (US)

(72) Inventors: Dong An, Cupertino, CA (US); Yang Zhao, Andover, MA (US); Haipeng Ding, San Jose, CA (US); Jong-Ki Lee, San Jose, CA (US)

(73) Assignee: MEMSIC, INC., Andover, MA (US)

( * ) Notice: Subject to any disclaimer, the term of this patent is extended or adjusted under 35 U.S.C. 154(b) by 419 days.

(21) Appl. No.: 14/418,761

(22) PCT Filed: Aug. 1, 2013

(86) PCT No.: PCT/US2013/053222
§ 371 (c)(1),
(2) Date: Jan. 30, 2015

(87) PCT Pub. No.: WO2014/022664
PCT Pub. Date: Feb. 6, 2014

(65) Prior Publication Data
US 2015/0177020 A1 Jun. 25, 2015

Related U.S. Application Data

(60) Provisional application No. 61/678,638, filed on Aug. 2, 2012.

(51) Int. Cl.
| | |
|---|---|
| *G01C 17/38* | (2006.01) |
| *G01C 25/00* | (2006.01) |
| *G06K 9/62* | (2006.01) |
| *G01P 21/00* | (2006.01) |
| *G01R 35/00* | (2006.01) |
| *G01P 15/00* | (2006.01) |

(52) U.S. Cl.
CPC ............. *G01C 25/00* (2013.01); *G01C 17/38* (2013.01); *G01P 21/00* (2013.01); *G01R 35/00* (2013.01); *G06K 9/6293* (2013.01); *G01P 15/00* (2013.01)

(58) Field of Classification Search
CPC ...... G01C 17/38; G01C 25/00; G06K 9/6293; G01P 15/00; G01P 21/00; G01R 35/00
See application file for complete search history.

(56) References Cited

U.S. PATENT DOCUMENTS

| | | | | |
|---|---|---|---|---|
| 4,303,978 A | * | 12/1981 | Shaw ................... | G01C 21/16 |
| | | | | 244/177 |
| 6,459,990 B1 | * | 10/2002 | McCall ................ | G01C 21/165 |
| | | | | 701/21 |

(Continued)

FOREIGN PATENT DOCUMENTS

CN 102171628 8/2011

OTHER PUBLICATIONS

Demoz Gebre-Egziabher et al., "Calibration of Strapdown Magnetometers in the Magnetic Field Domain", Apr. 1, 2006, Journal of Aerospace Engineering, vol. 19, issue 2, pp. 1-45.*

*Primary Examiner* — Mischita Henson
(74) *Attorney, Agent, or Firm* — Preti Flaherty Beliveau & Pachios LLP

(57) ABSTRACT

Method and apparatus of integrating a three-axis magnetometer and a three-axis accelerometer to provide attitude and heading, calibrated magnetometer and accelerometer data, and angular rate, while removing sensor error sources over time and temperature and to compensate for hard and soft iron distortions of the Earth magnetic field. Filtered accelerometer data are corrected to account for various error sources. The magnetic heading is calculated from a horizontal magnetic field vector transformed from three dimensional Earth's magnetic field vector by using quasi-static roll (Continued)

and pitch angles from the filtered accelerometer data. A first Kalman filter estimates the state vector, based on the principle that the magnitude of local Earth's magnetic field vector is constant, to form hard and soft iron correction matrices. A second Kalman filter estimates a correction matrix of coupled remaining soft iron and the misalignment of the magnetometer and the accelerometer, as the dot product of local Earth's magnetic field vector and a corrected gravitational acceleration vector, at a quasi-static position, is constant. The three dimensional Earth's magnetic field vector is received by removing the hard and soft irons through the soft iron and hard iron correction matrixes.

17 Claims, 11 Drawing Sheets

(56) References Cited

U.S. PATENT DOCUMENTS

| | | |
|---|---|---|
| 9,261,980 B2 | 2/2016 | Bassompiere et al. |
| 2002/0116125 A1 | 8/2002 | Lin |
| 2002/0173910 A1 | 11/2002 | McCall et al. |
| 2010/0097268 A1 | 4/2010 | Roh |
| 2011/0199298 A1 | 8/2011 | Bassompiere et al. |
| 2011/0307213 A1* | 12/2011 | Zhao ............... G01C 17/30 702/153 |

* cited by examiner

METHOD AND APPARATUS FOR DATA FUSION OF A THREE-AXIS MAGNETOMETER AND THREE AXIS ACCELEROMETER

CROSS-REFERENCE TO RELATED APPLICATION

Priority of U.S. Provisional Patent Application Ser. No. 61/678,638 for "Method for 6-Axis Magnetometer and Accelerometer Fusion with Intelligent Autonomous Calibration," filed Aug. 2, 2012, is claimed.

BACKGROUND OF THE INVENTION

The availability of low cost and small microelectromechanical systems (MEMS) accelerometers has created a large variety of new commercial applications with their inclusion in smart phones and other handheld or mobile devices. For example, as compared with other types of MEMS accelerometer technologies, a thermal MEMS accelerometer, which is based on the principle of measuring internal changes of convection heat transfer due to the acceleration applied, has superior advantages for consumer applications, including a low cost fabrication process, high reliability and very good shock or impact resistance.

Furthermore, advances in magnetometer technologies also make it possible (cost, size and power consumption) to closely integrate a three-axis magnetometer with a three-axis accelerometer in a mobile device to form an electronic compass to provide quasi-static attitude and heading information for enabling new applications, for example, location-based services.

The local environment in which a magnetometer or accelerometer is deployed can cause measurement fluctuations. As one example, changes in temperature can affect the measurements as can other factors.

The principle of a magnetic compass is to determine a magnetic heading by measuring the Earth's magnetic field. However, inside a mobile device, such as a smartphone, there are components that interfere with magnetic field measurements—traditionally referred to as "hard" and "soft" iron distortions/interferences. An example of a hard iron is a permanent magnet such as those found in the speakers on a smartphone or on the holster in which the smartphone is kept. A soft iron is, for example, a component made from steel such as an EMI shield or the screws or battery contacts found in the smartphone. Steel provides a "lower resistance" path to the magnetic field than does the surrounding air so the field is diverted and the diversion has to be compensated for. The hard iron distortions act like a change of magnetometer bias. The soft iron distortions act like changes to a magnetometer's scale factor. The hard and soft irons need to be accounted for in order to accurately determine heading.

The technical challenges for implementing a three-axis magnetometer and a three-axis accelerometer in a mobile device include dealing with sensor error sources, including bias, scale factor and misalignment of the axes, and distortions of the earth's magnetic field, e.g., hard and soft irons, which contribute to the error of attitude and heading. As cost is often the biggest concern in consumer applications, such as those in a smartphone, a sophisticated and, therefore, expensive, factory calibration of magnetometers and accelerometers is not commercially practical.

BRIEF SUMMARY OF THE INVENTION

Embodiments of the present invention implement sensor data fusion, i.e., the combining of data available from sensors in order to accurately determine heading and orientation of a device.

The data fusion of a three-axis magnetometer and a three-axis accelerometer provides an attitude and heading, on-line calibrated magnetometer and accelerometer data, and an angular rates solution. As a result, magnetometer sensor calibration to remove sensor error sources over time and temperature and to recover Earth's magnetic field measurements from hard and soft iron distortions is provided.

Embodiments of the present invention provide a method and apparatus for data fusion of a three-axis magnetometer and a three-axis accelerometer to provide an attitude and heading, on-line calibrated magnetometer and accelerometer data, and angular rates solution, wherein the magnetometer and accelerometer data are filtered first to reject outliers and suppress noise; the filtered accelerometer data are further corrected, based on the error sources that are estimated by on-line accelerometer auto-calibration; the filtered magnetometer data are further corrected, based on the hard and soft-iron distortions that are estimated by on-line magnetometer auto-calibration; the corrected accelerometer data is used to compute quasi-static roll and pitch angles; the roll and pitch angles are used to form a transformation matrix from the body to level coordinate frames. The corrected magnetometer data is transformed from the body frame to level frame to generate the horizontal magnetic field vector, the magnetic heading can be calculated using the horizontal magnetic field vector; the roll, pitch, heading are used to derive angular rates; the calibrated accelerometer data and the derived angular rates are used to detect dynamic and static status which are in turn used to aid the on-line magnetometer auto-calibration and accelerometer auto-calibration.

BRIEF DESCRIPTION OF THE SEVERAL VIEWS OF THE DRAWINGS

Various aspects of at least one embodiment of the present invention are disclosed below with reference to the accompanying figures. It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. For purposes of clarity, however, not every component may be labeled in every drawing. These figures are provided for the purposes of illustration and explanation and are not intended as a definition of the limits of the invention. In the figures.

DETAILED DESCRIPTION OF THE INVENTION

U.S. Provisional Patent Application Ser. No. 61/678,638 entitled "Method for 6-Axis Magnetometer and Accelerometer Fusion with Intelligent Autonomous Calibration," filed Aug. 2, 2012, is incorporated by reference herein in its entirety and for all purposes.

Embodiments of the present invention implement sensor data fusion, i.e., the combining of data available from accelerometer and magnetometer sensors in order to accurately determine heading and orientation of a device. The data fusion of a three-axis magnetometer and a three-axis accelerometer provides an attitude and heading, on-line calibrated magnetometer and accelerometer data, and an angular rates solution. As a result, a magnetometer sensor calibration to remove sensor error sources over time and temperature and to recover Earth's magnetic field measurements from hard and soft iron distortions is provided.

One embodiment of the present invention provides a method of providing a six-axis magnetic field/accelerometer sensor with both hard and soft iron calibration capability for a variety of applications. These applications include e-compass applications provided with quasi-static roll, pitch, and magnetic heading information. Soft gyroscope functions to provide a pseudo nine-axis solution including, for example, dynamic roll/pitch/heading angles, dynamic angular rates and acceleration determinations.

In order to better understand embodiments of the present invention, reference will now be made to FIGS. 1A-1C where a standard coordinate body frame (B) and a local-level frame (L), as known in avionics, are used with respect to a carrier 10 and a three-axis accelerometer 12 and three-axis magnetometer 14 that would be attached, or coupled to, the carrier 10. One of ordinary skill in the art will understand that the three-axis accelerometer 12 may incorporate three separate accelerometers orthogonally positioned with respect to one another and the three-axis magnetometer 14 may incorporate similarly arranged magnetometers.

The body axis (B) of the carrier 10 is defined as a coordinate frame (B) with a positive $X^B$ axis through the carrier's forward direction, as shown by an arrow F, a positive $Y^B$ axis through the right direction, as shown in the figure, and a positive $Z^B$ axis directed down to complete the right-handed three axes construct. The XYZ axes of the accelerometer 12 and magnetometer 14 may be aligned with the device's body coordinate frame or with constant misalignment, i.e., an offset, which has no effect on the teachings and embodiments of the present invention as described herein.

Figure 1A:
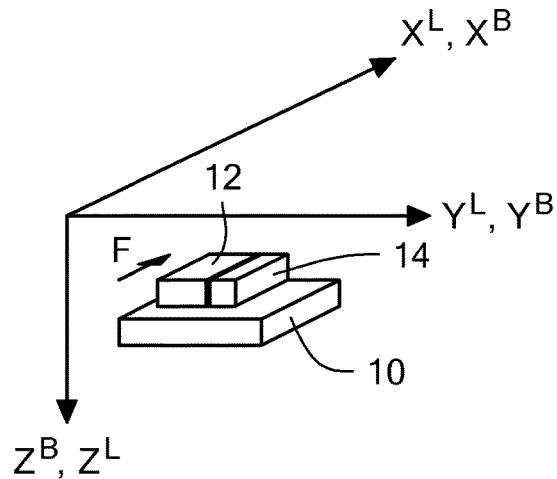
FIGS. 1A, 1B and 1C are representations of a standard coordinate body frame (B) and a local-level frame (L) system with respect to a three-axis accelerometer and its carrier.
Figure 1B:
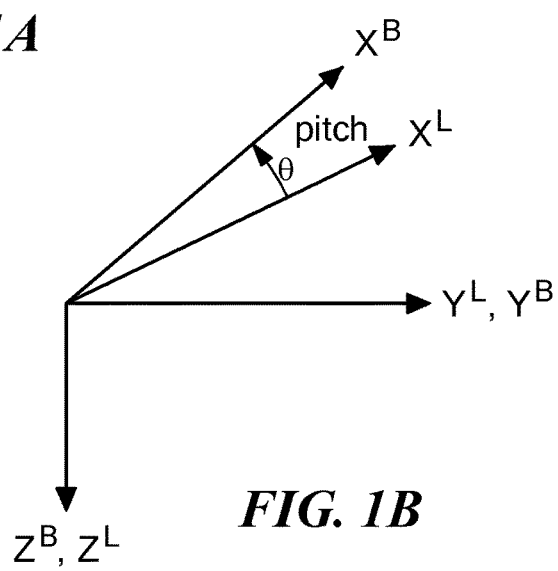
Figure 1C:
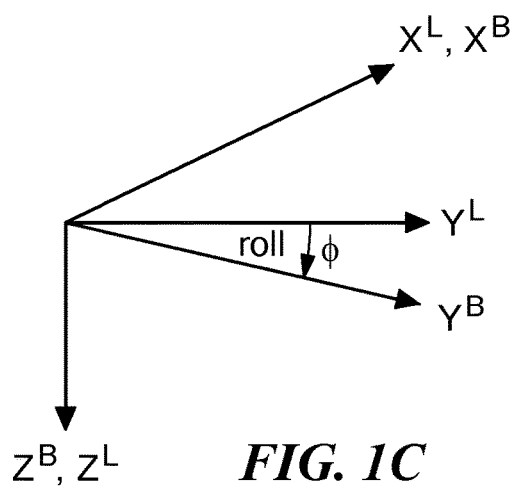

As shown in FIGS. 1A-1C, the relationships between the body frame and the local level frame. The local level frame is mathematically defined so that a roll angle $\phi$ and a pitch angle $\theta$ are also defined. The local-level frame (L) is defined as follows: the X-axis $X^B$ of the body frame (B) is projected to the local level plane as the X-axis $X^L$ of the local-level frame (L); the Y-axis $Y^L$ of the local-level plane is perpendicular to the X-axis $X^L$; and the Z-axis $Z^L$ of the local-level plane is down.

The relationship of the raw magnetic field measurements from a three-axis magnetometer 14 and the corresponding calibrated measurements can be modeled as follows:

$$\text{Mag}_c = m_{misAlign} * m_{sf} * (\text{Mag}_m - \text{bias}) \qquad (1\text{-}1)$$

Where, $\text{Mag}_m$=the XYZ raw measurements from the three-axis magnetometer 14;

Bias=the bias of the XYZ raw measurements from the three-axis magnetometer 14;

$m_{sf}$=the scale factor error matrix;

$m_{misAlign}$=the misalignment matrix; and $\text{Mag}_c$=the calibrated XYZ measurements from the three-axis magnetometer 14.

To obtain optimal sensor fusion performance, these sensor error matrixes Bias, $m_{sf}$ and $\text{Mag}_c$, are identified through a calibration process.

If there are hard and soft irons distortions, the calibrated and hard/soft iron compensated XYZ measurements from the three-axis magnetometer 14 can further be modeled as follows:

$$\text{Mag}_{cc} = m_s * (\text{Mag}_c - h) = S * (\text{Mag}_m - H) \qquad (1\text{-}2)$$

Where, $m_s$=soft iron distortion matrix;

h=hard iron distortion vector;

$S = m_s * m_{misAlign} * m_{sf}$ which is the equivalent soft iron distortion matrix;

$H = \text{Bias} + (m_{misAlign} * m_{sf})^{-1} * h$ which is the equivalent hard iron distortion matrix; and $\text{Mag}_{cc}$=the calibrated and hard/soft iron compensated XYZ measurements from the three-axis magnetometer, which are used for the data fusion as described herein.

As seen from Equation (1-2), the equivalent soft iron distortion matrix and the equivalent hard iron distortion matrix include soft irons and hard irons as well as the sensor error matrixes.

An objective of the automatic calibration method in accordance with an embodiment of the present invention is to estimate the equivalent soft iron distortion matrix S and the equivalent hard iron distortion matrix H for the magnetometer measurement compensation. The calibrated and hard/soft iron compensated XYZ measurements from the three-axis magnetometer 14 will be further used to compute the heading.

As is known, the length of the Earth's magnetic field vector at a location is constant. Therefore, $$\text{Mag}_{cc}^T * \text{Mag}_{cc} = E^T * E = L \qquad (1\text{-}3)$$

Where,

E=the Earth's magnetic field vector in the location; and

L is the squared length of the Earth's magnetic field vector at the location.

Equation (1-3) can be further expressed, as follows:

$$X^T*A*X+B^T*X+C=0 \quad (1\text{-}4)$$

Where, $$X = Mag_m = \begin{bmatrix} mag_x \\ mag_y \\ mag_z \end{bmatrix}$$

$A=S^T*S$;
$B=-2H^T A$; and
$C=H^T*A*H-L$.

Therefore, the soft iron distortion matrix S and the hard iron distortion matrix H could be resolved by estimating the A, B, and C matrix from the ellipsoid quadratic equation (1-4).

Figure 2A:
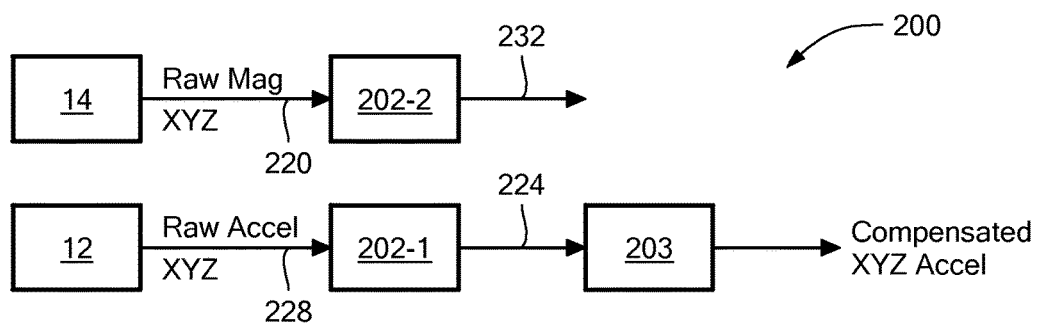
FIGS. 2A and 2B are functional block diagrams of an embodiment of the present invention.
Figure 2B:
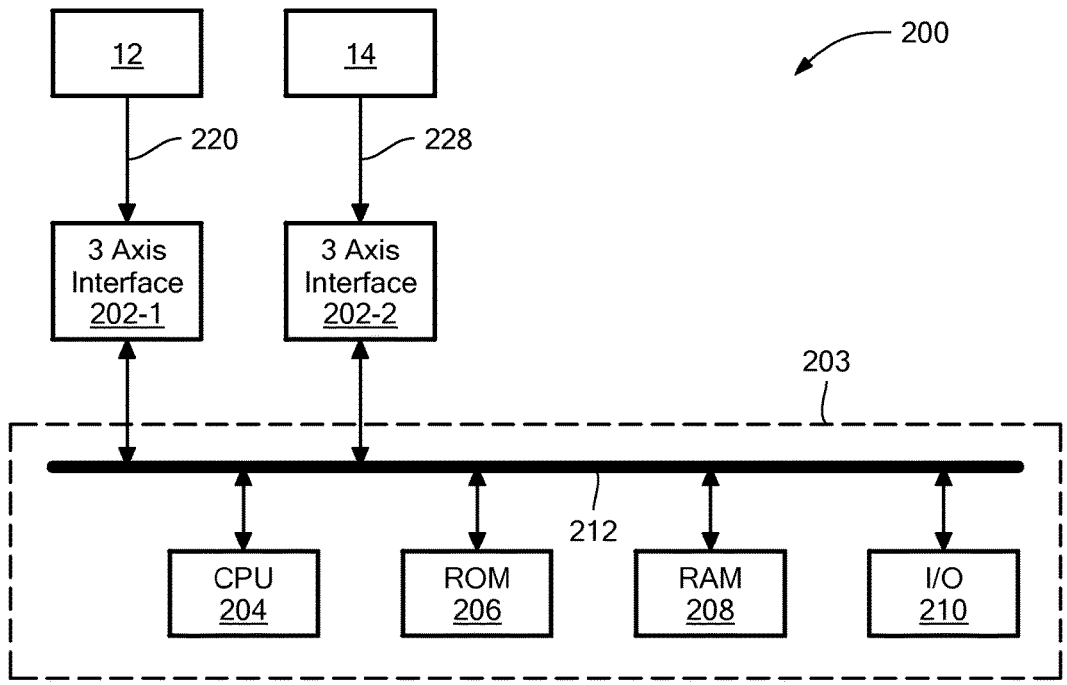

As shown in FIGS. 2A and 2B, and as an overview, generally, a system 200 for calibrating, or compensating, for errors in a six-axis device, i.e., a device having a three-axis accelerometer 12 and a three-axis magnetometer 14 in accordance with one embodiment of the present invention includes receiving raw signals from the three-axis accelerometer 12 and from the magnetometer 14. An accelerometer interface 202-1 receives the raw accelerometer XYZ signal 220 and processes the signals to provide compensated XYZ accelerometer signal 224 to a compensation circuit or module 203, as will be described in more detail below.

The accelerometer interface 202-1 may operate in accordance with the principles described in U.S. Patent Publication US 20110264393, filed Jan. 21, 2011 and entitled "System And Method For Calibrating A Three-Axis Accelerometer," the entire contents of which is hereby incorporated by reference for all purposes, to provide the compensated signals. There, the error estimation of the three-axis accelerometer device over time and temperature ranges is achieved by using acceleration data taken when the device is "static," i.e., not moving or not undergoing acceleration, during normal operation of the three-axis accelerometer. During these static condition periods the three-axis accelerometer senses only the earth's gravitational acceleration. Three estimation processes for error sources are implemented to use the X, Y, and Z acceleration measurements accumulated during these static condition periods so that the error sources of the three-axis accelerometer, including Z-axis bias, can be estimated and compensated for.

Of course, one of ordinary skill in the art will understand that there are other mechanisms for processing acceleration signals for use and the embodiments of the present invention are not limited to any one particular approach unless specified herein.

A magnetometer interface 202-2 receives the raw magnetic XYZ signal 228 and processes the signals to provide an XYZ magnetic signal.

Thus, in further explanation, as shown in FIG. 2B, the compensation module 203 includes a CPU (Central Processing Unit) 204, a Read Only Memory (ROM) device 206, a Random Access Memory (RAM) device 208, an I/O device 210 and a bus 212. As shown, these devices communicate with one another using the bus 212. A protocol used for communicating among the devices and across the bus 212 can be any one of a number of known protocols. Further, while only one bus is shown, one of ordinary skill in the art will understand that multiple busses could be implemented where only certain devices are on a respective bus in communication with one another and some devices may not be on the same bus as others.

The compensation module 203 could be implemented, in one embodiment, by using the CPU and associated devices found in most smartphones. Thus, one embodiment could be implemented within an e-compass application on a smartphone running, for example, iOS from Apple Corporation or the Android operating system from Google.

The accelerometer interface 202-1 operates to translate the signals received from the three-axis accelerometer 12 and may include analog signal processing components such as analog-to-digital converters, signal filters, etc. While shown separately in FIG. 2B, the compensation module 203, the interfaces 202-1 and 202-2 and the accelerometer 12 and magnetometer 14 could be implemented in a single device having only external connections for the bus 212. Alternatively, any combination or sub-combination of these components into a single package could be provided. In one embodiment, a device including the interfaces 202-1, 202-2 and the compensation module 203, configured to communicate over the bus 212, could be provided in a single package in order to provide the compensation features described herein to a known device, i.e., a "retrofitting" of an existing device. Still further, the compensation module 203 and the interfaces 202-1 and 202-2 could be implemented by an application running on the CPU 204. The interface devices 202-1, 202-2 also could be implemented as an ASIC (Application-Specific Integrated Circuit) device.

The ROM device 206 stores various software or firmware programs to be executed by the CPU 204 to implement functions described herein while the RAM device 208 is used to temporarily store data used by the CPU 204 or other devices. One of ordinary skill in the art understands the functionality of these components and further details are not necessary to understand the embodiments of the present invention described herein. Still further, it is understood that the other components that may be found in a commercial device to provide other functions, e.g., power, phone, internet browsing, etc., are not shown here for reasons of clarity.

Figure 3:
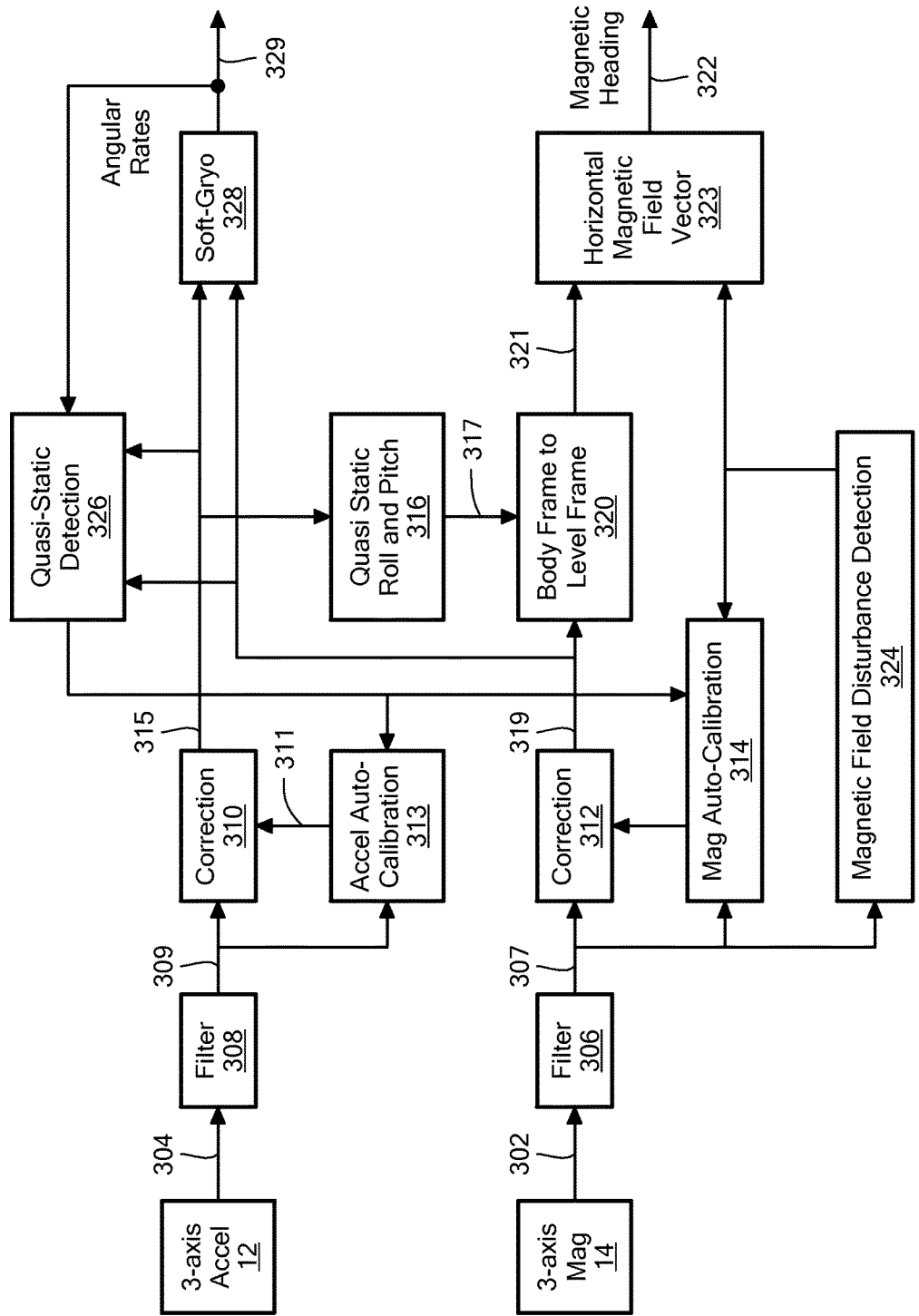
FIG. 3 is a functional block diagram that illustrates an embodiment of the present invention.

Referring to FIG. 3, in one embodiment of the present invention, the autonomous calibration is performed without user interaction and does not require an accurate rate table or the generation of a known reference magnetic field. The magnetometer and accelerometer data 302, 304 are filtered 306, 308 first to reject outliers and suppress noise. The filtered accelerometer data 309 are further corrected 310 based on the error sources 311 that are estimated by the accelerometer auto-calibration 313. The filtered magnetometer data 307 are further corrected 312, based on the hard and soft-iron distortions that are estimated by the magnetometer auto-calibration 314. The corrected accelerometer data 315 is used to compute 316 quasi-static roll and pitch angles 317; the roll and pitch angles 317 are used to form 320 a transformation matrix from the body to level coordinate frames 321. The corrected magnetometer data 319 is transformed 320 from the body frame to the level frame to generate the horizontal magnetic field vector 321; and the magnetic heading 322 can be calculated using the horizontal magnetic field vector 321.

Concurrently, the magnetic field disturbance is detected 324 to aid the magnetic auto-calibration 314. As incorrect results might be obtained while a magnetic field disturbance is occurring and the magnetic field is changing, therefore, magnetic disturbances must be identified and accounted for. The angular rates are computed by using the corrected accelerometer data 315 and the corrected magnetometer data 319. Quasi-static time points (periods) are determined 326, based on the corrected accelerometer data 315, the corrected magnetometer data 319, and the angular rates 329, to schedule accelerometer auto-calibration and fine magnetometer auto-calibration.

Figure 4:
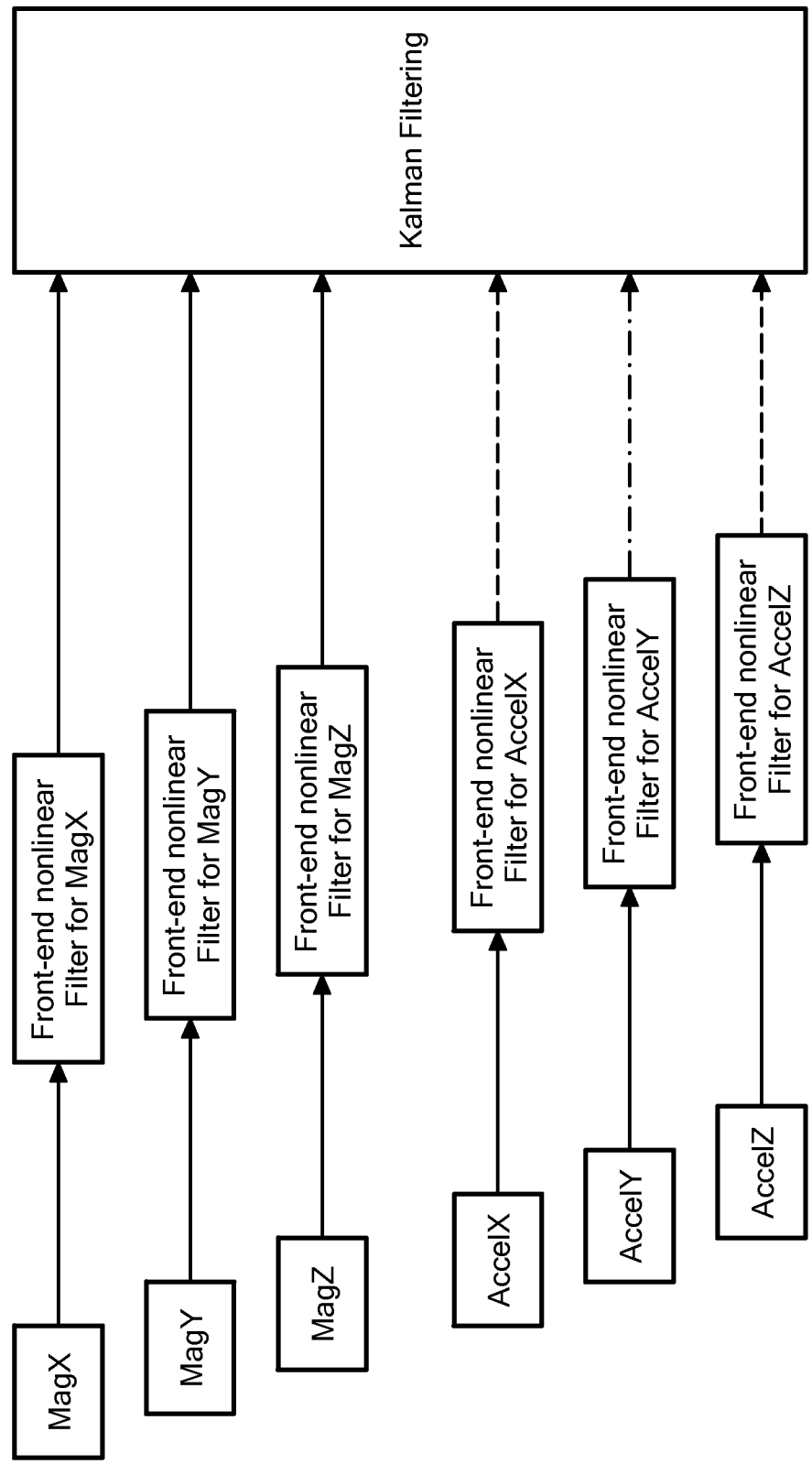
FIG. 4 is a functional block diagram that illustrates an embodiment of the magnetometer calibration of the present invention.

As known, it is relatively important in e-compass applications in mobile devices to estimate hard and soft irons. Referring to FIG. 4, the auto-calibration approach for three-axis magnetometer may use the filtered magnetometer data only or use both the filtered magnetometer data and the filtered accelerometer.

Figure 5:
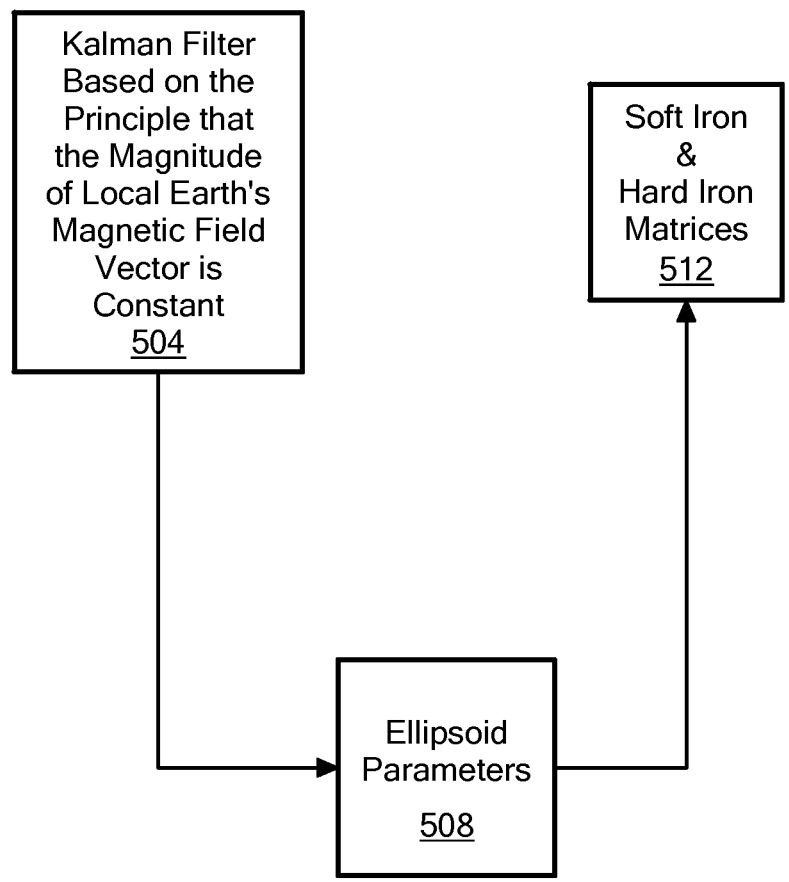
FIG. 5 is a functional block diagram that illustrates one magnetometer calibration scheme in accordance with an embodiment of the present invention.

Referring to FIG. 5, one calibration approach for a three-axis magnetometer employs a Kalman filter 504. The state vector of the Kalman filter 504 contains nine variables for a generic ellipsoid model. The Kalman filter estimates the state vector in a way that balances the needs of maintaining the previous state estimates with the needs of the correction, based on the principle that the magnitude of local Earth's magnetic field vector is constant. The estimated ellipsoid parameters 508 are used to form the hard and soft iron correction matrices 512.

The ellipsoid quadratic equation (1-4) can be further re-written, as follows:

$$\mathrm{mag}_x^2 + \mathrm{mag}_y^2 + \mathrm{mag}_z^2 = (\mathrm{mag}_x^2 + \mathrm{mag}_y^2 - 2*\mathrm{mag}_z^2)*\theta_1 + \\ (\mathrm{mag}_x^2 - 2*\mathrm{mag}_y^2 + \mathrm{mag}_z^2)*\theta_2 + 4*\mathrm{mag}_x*\mathrm{mag}_y*\theta_3 + \\ 2*\mathrm{mag}_x*\mathrm{mag}_z*\theta_4 + 2*\mathrm{mag}_y*\mathrm{mag}_z*\theta_5 + \mathrm{mag}_x*\theta_6 + \\ \mathrm{mag}_y*\theta_7 + \mathrm{mag}_z*\theta_8 + \theta_9 \quad (1\text{-}5)$$

The Kalman filter's state vector includes:

$$X = [\theta_1, \theta_2, \theta_3, \theta_4, \theta_5, \theta_6, \theta_7, \theta_8, \theta_9]^T$$

Equation (1-5) is employed as the measurement equation of the Kalman filter 504. The estimated state vector can form the hard iron correction matrix, as follows $$H = [h_1, h_2, h_3]^T \quad (1\text{-}6)$$

where
$h_1 = ((f*x(6)-e*x(7))*(b*c-f*f)-(x(7)*c-x(8)*f)*(d*f-b*e))/((a*f-d*e)*(b*c-f*f)-(d*c-e*f)*(d*f-b*e))/2;$
$h_2 = (0.5*(f*x(6)-e*x(7))-(a*f-d*e)*h_1)(d*f-b*e);$
$h_3 = (x(7)-2*d*h_1-2*b*h_2)/f0/2;$
$a = 1-x(1)-x(2);$
$b = 1-x(1)+2*x(2);$
$c = 1+2*x(1)-x(2);$
$d = -2*x(3);$
$e = -x(4);$
$f = -x(5);$
$t = x(9);$ The soft-iron correction matrix S can be formed, as follows:

$$S = U*\sqrt{D}*U^T \quad (1\text{-}7)$$

Where, the matrices U and D are the results of eigen decomposition of the matrix A. The matrix D is a diagonal matrix with the eigen values; and the matrix U is composed of their corresponding eigenvectors;

$$A = \begin{bmatrix} a & d & e \\ d & b & f \\ e & f & c \end{bmatrix} \Big/ g$$

$$g = t + a*h_1^2 + b*h_2^2 + c*h_3^2 + 2*d*h_1*h_2 + 2*f*h_2*h_3 + 2*e*h_1*h_3$$

Figure 6:
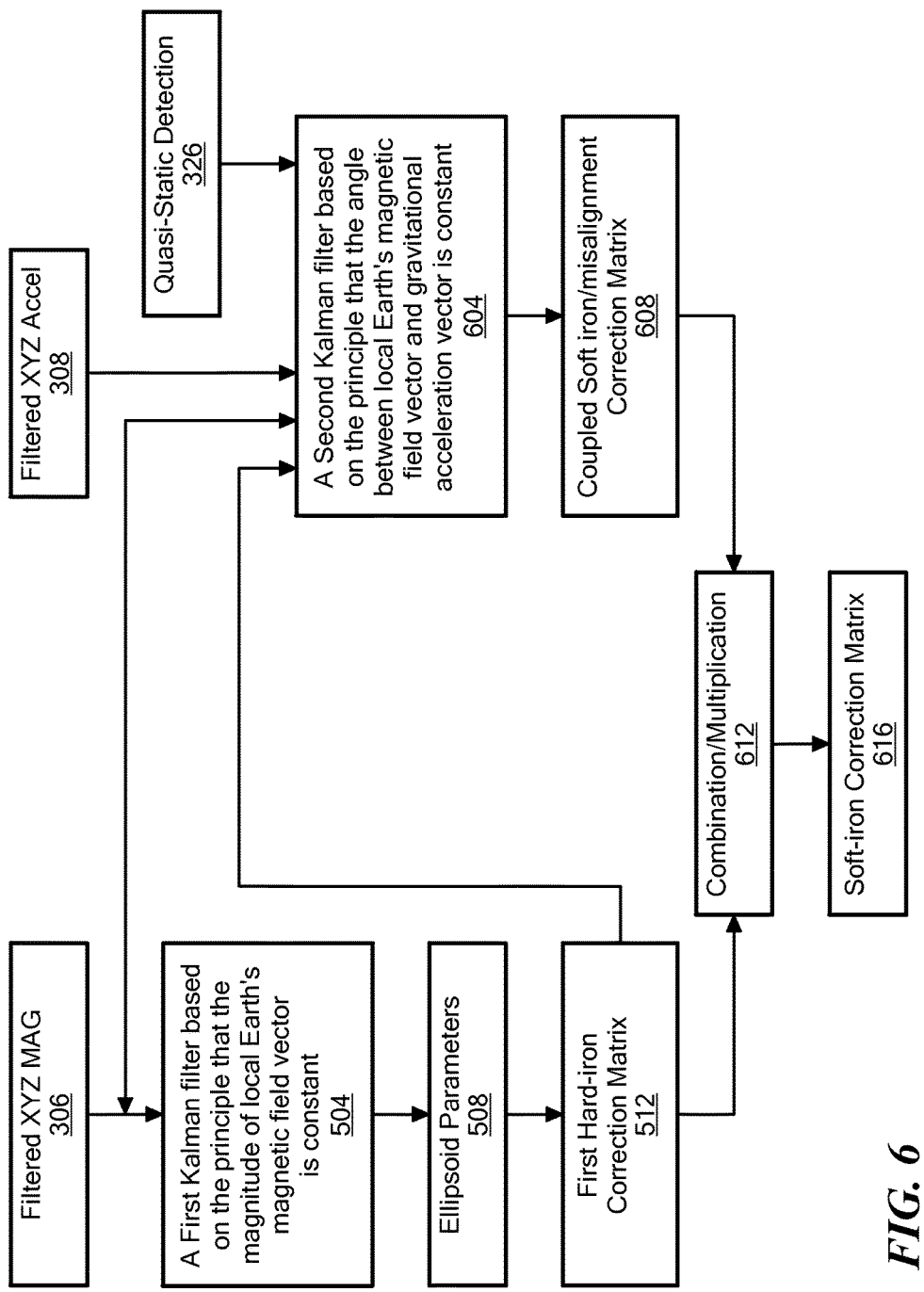
FIG. 6 is a functional block diagram that illustrates another magnetometer calibration scheme in accordance with an embodiment of the present invention.

Referring to FIG. 6, in another calibration approach according to an embodiment of the present invention, a three-axis magnetometer employs first and second Kalman filters where the first Kalman filter 504 contains nine variables for a generic ellipsoid. The first Kalman filter 504, based on the principle that the magnitude of local Earth's magnetic field vector is constant, estimates the state vector to balance the needs of maintaining the previous state with the needs of the correction. The estimated ellipsoid parameters 508 are used to form the hard and first soft iron correction matrices 512. The second Kalman filter 604 models and estimates a coupled soft iron/misalignment correction matrix 608, based on the principle that the angle between the local Earth's magnetic field vector and gravitational acceleration vector is constant. The coupled soft iron/misalignment correction matrix 608 models the remaining soft irons after the correction by the first Kalman filter 504 and the misalignment between the three-axis magnetometer and three-axis accelerometer. In an ideal environment the three axes of the magnetometer would be parallel, respectively, to the three axes of the accelerometer. During the manufacturing process, however, a misalignment could occur and its presence could be significant. With the remaining soft irons, the second Kalman filter 604 is not able to separate remaining soft irons from the misalignment, but is designed to estimate the coupled matrix (the product of the remaining soft iron matrix and the misalignment matrix).

A final soft-iron correction matrix 616 is formed by multiplying 612 the first soft iron matrix 512 with the coupled soft iron/misalignment correction matrix 608, as described as follows.

By applying the hard and soft iron correction matrices (1-6) and (1-7) to the XYZ raw measurements from the three-axis magnetometer, $\mathrm{Mag}_m$, the corrected magnetometer vector becomes:

$$\mathrm{Mag}_{cc}^1 = S*(\mathrm{Mag}_m - H) \quad (1\text{-}8)$$

The second Kalman filter 604 is designed to fine tune the soft-iron correction matrix 608, by $$\mathrm{Mag}_{cc} = S_f * \mathrm{Mag}_{cc}^1 = S_f * S * (\mathrm{Mag}_m - H) \quad (1\text{-}9)$$

Where, $S_f$ is estimated by the second Kalman filter 604, which represents the remaining soft irons after the correction by the first Kalman filter 504 and the misalignment between the three-axis magnetometer and three-axis accelerometer.

As known, the angle between the local Earth's magnetic field vector and gravitational acceleration vector is constant. Let $\mathrm{Accel} = [a_x, a_y, a_z]^T$ represent the measurements of a three-axis accelerometer. At a quasi-static moment, i.e., a moment where the object is in a static or non-accelerating condition, the dot product of the Earth's magnetic field vector and a gravitational acceleration vector is constant:

$$\mathrm{Mag}_{cc} * \mathrm{Accel} - \mathrm{const} = 0 \quad (1\text{-}10)$$

The second Kalman filter 604 models the fine soft-iron correction matrix $S_f$ 608 and the unknown dot product as the state vector and uses the equation (1-10) as the measurement equation to estimate the state vector.

Figure 7:
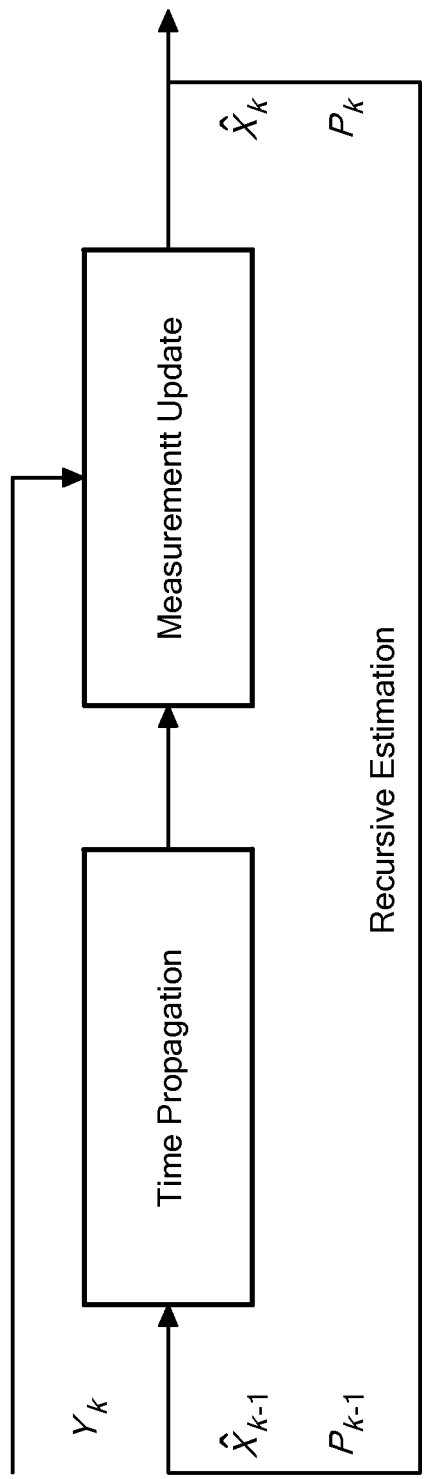
FIG. 7 is a functional block diagram that illustrates Kalman filtering in accordance with an embodiment of the present invention.

Referring to FIG. 6, the second Kalman filter 604 recursively estimates its state vector through the time propagation and measurement updates. The input to the second Kalman filter 604 is the magnetometer data that has been corrected by the first Kalman filter 504, the calibrated accelerometer data, and quasi-static detection 326 output. FIG. 7 illustrates the time propagation and measurement updates of a Kalman filter.

Figure 8:
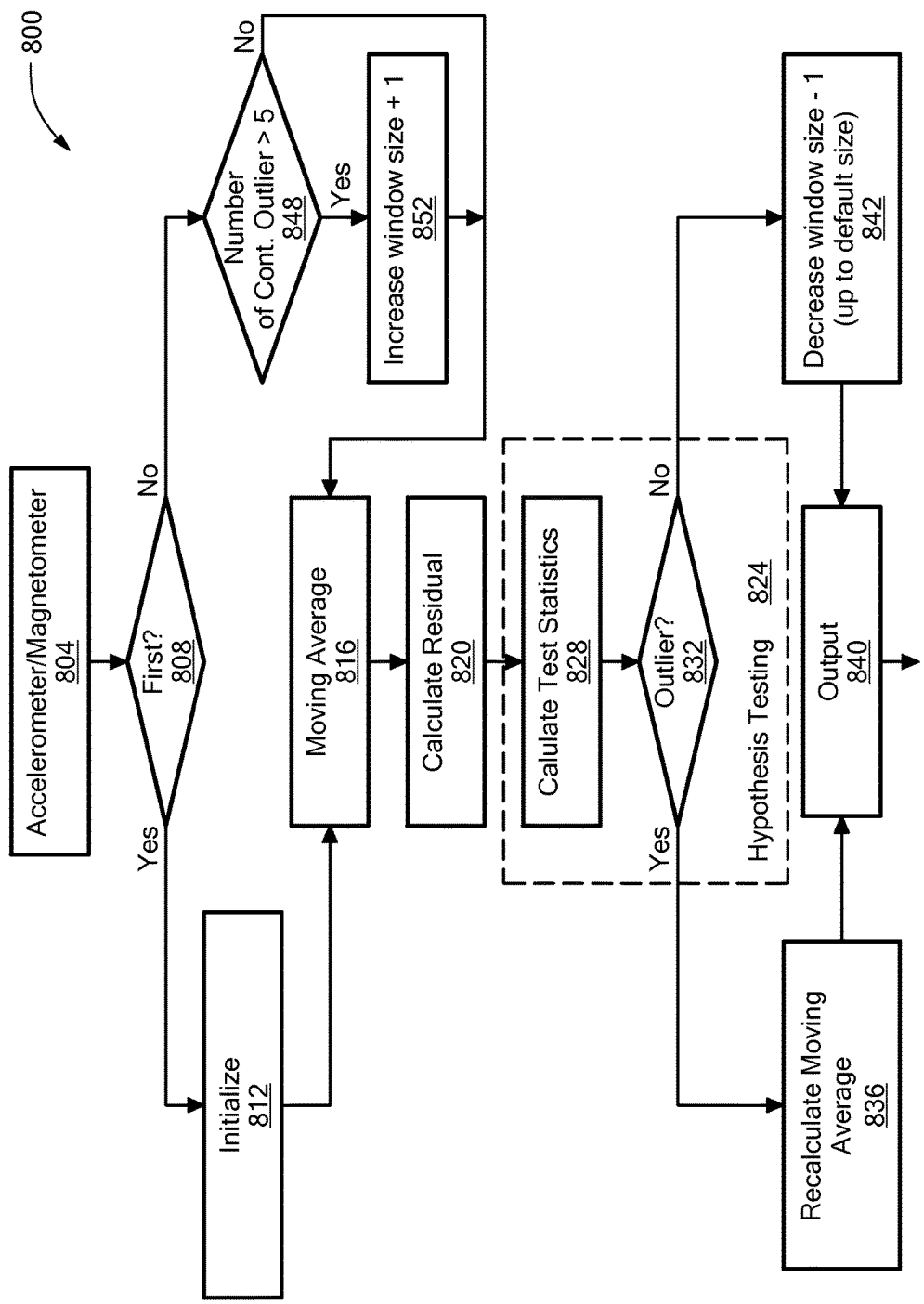
FIG. 8 is a functional flow chart that illustrates filtering in accordance with an embodiment of the present invention.

Referring to FIG. 8, a design goal of the filters 306, 308 is to reduce white noise and detect/eliminate outliers in the sensor measurements. The filters 306, 308 consist of weighted moving average (WMA) and hypothesis testing (HT) operations that are applied, respectively, to the magnetometer and accelerometer measurements.

Thus, a method 800 starts with a step 804 of receiving the raw accelerometer and magnetometer data 304, 302 and if it is determined, step 808, that this is the first data then control passes to step 812 where the process is initialized and, subsequently, step 816, a weighted moving average is calculated. The initialization step implements the following:
(1) Initialize a length of the moving average window to some default number, such as 5.
(2) Initialize the number of continuous outliers to zero;
(3) Initialize all data points in the moving average window to the first data;
(4) Initialize all the corresponding residue of the data point to zeros. The residue of each data is defined as the absolute value of the difference between the averaged data and the data point; and
(5) Initialize a weight of each data point to one.

Weighted moving average is the mean of the previous n measurements ($m_t$) with variable weight ($w_t$). For example, weighted moving average for ten samples of sensor measurements is the mean of the previous ten sensor measurements. The weight ($w_t$) for each data point is decided and assigned, based on the hypothesis testing 824 as discussed below.

$$\frac{w_t \cdot m_t + w_{t-1} \cdot m_{t-1} + \ldots + w_{t-9} \cdot m_{t-9}}{10}$$

A residual is calculated at step 820.

The hypothesis testing 824 determines if the latest data that comes to the moving average window is an outlier or not by testing the residues. The general procedure of this step 824 includes setting up the relevant null and alternative hypothesis.

$H_0: m_t = 0$ (not outlier)
$H_1: m_t \neq 0$ (outlier)

Where, the hypothesis $H_0$ means that the latest data is an outlier; the hypothesis $H_1$ means that the latest data is not an outlier.

Test statistic for this hypothesis testing 824 is embodied as follows. The preferred Test Statistics, T, are calculated, step 828, and it is determined, step 832, whether the test statistics are in the confidence interval (critical region) of F distribution (with a significance level α).

$$T := \frac{(\eta_j^T \tilde{e})^2}{(\tilde{e}^T \tilde{e}) - (\eta_j^T \tilde{e})^2 / (n - m - 1)} \sim F(1, n - m - 1, \alpha)$$

where $\tilde{e} = y - A \cdot \hat{x}$ (y is the measurement and $\hat{x}$ is estimation from Gauss-Markov model, $y = A \cdot x + e$, $rk(A) = m$), n is number of measurement and $\eta_j = [0 \ldots 1]^T$ A decision is made as "Accept H0" or "Reject H0" (Accept H0 if T is in confidence interval of F distribution (α=0.05) and reject H0 if T is not in confidence interval of F distribution). If the decision is made as "Accept H0," then the weight of the latest data is set to zero and the average of the moving average window will be recalculated in Step 836.

Returning now to step 808, if this is not the first set of data, control passes to step 848 where the number of outliers is compared to a predetermined number, for example, five, for determining if the length of the moving average window needs to be increased. If the number of outliers is greater than the predetermined number then, step 852, the window size is incremented by one and control passes to step 816. Otherwise, control passes from step 848 directly to step 816 without a change to the window size The output 840 consists of the filtered magnetometer and accelerometer data 307, 309.

Figure 9:
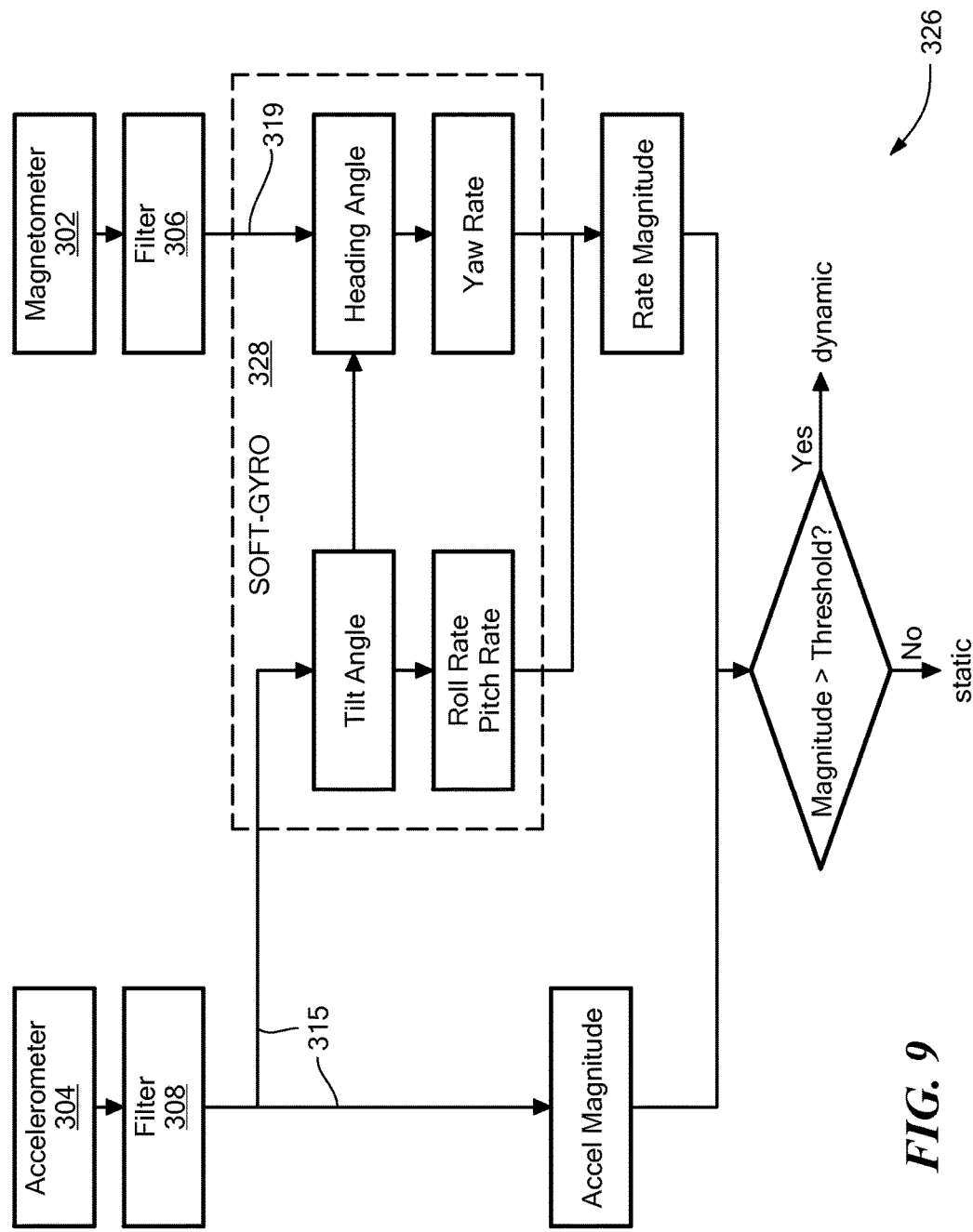
FIG. 9 is a functional block diagram that illustrates quasi-static detection in accordance with an embodiment of the present invention.

Referring to FIG. 9, the quasi-static detection processing 326 detects quasi-static moments of the sensor platform. The quasi-static detection processing 326 receives the filtered sensor and corrected sensor data 315, 319 and the angular rate 329 of the soft-gyro processing 328 and thresholds to determine quasi-static moment. "Soft-gyro" is software-based gyro, as compared with physical hardware of gyro devices. The soft-gyro processing 328 calculates the angular rates from accelerometer and magnetometer data 315, 319, by taking advantage of the carrier's dynamics and the physical condition that the carrier experiences. As soft-gyro processing 328 does not involve actual gyros, there is no cost associated with its introduction to the processing. The quasi-static detection processing 326 uses a threshold mechanization to determine quasi-static moments.

Figure 10:
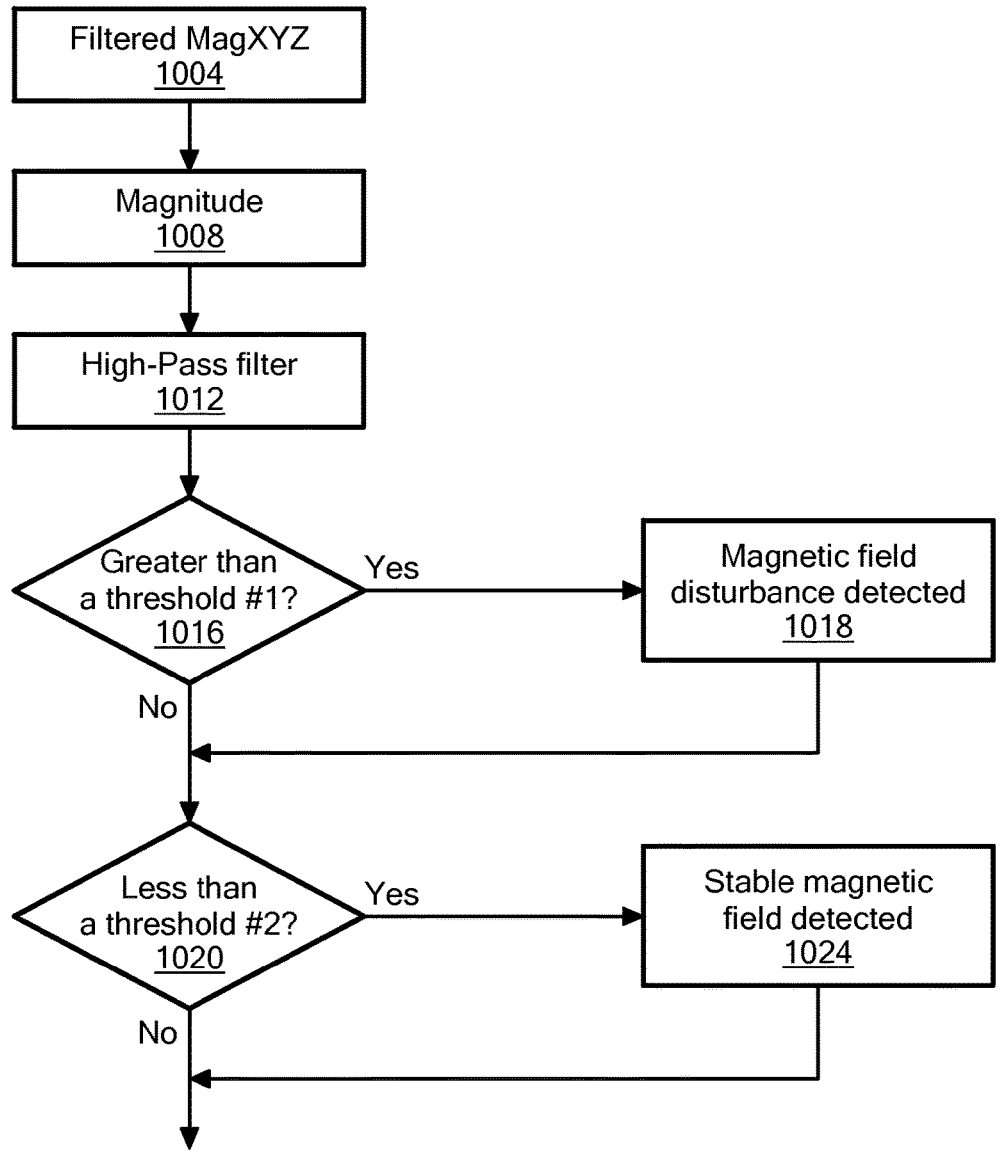
FIG. 10 is a functional block diagram that illustrates magnetic field disturbance detection in accordance with an embodiment of the present invention.

Referring to FIG. 10, in the magnetic field disturbance detection 324, the magnitude 1008 of filtered magnetic field vector 1004 is high-pass filtered 1012. If the filtered magnitude is greater than a first predetermined threshold, step 1016, it is determined, step 1018, that a magnetic field disturbance to the local magnetic field is occurring. If the filtered magnitude 1008 is less than a second predetermined threshold, step 1020, it is determined, step 1024, that the disturbance is gone and the local magnetic field is stable. The first predetermined threshold is greater than the second predetermined threshold.

Figure 11:
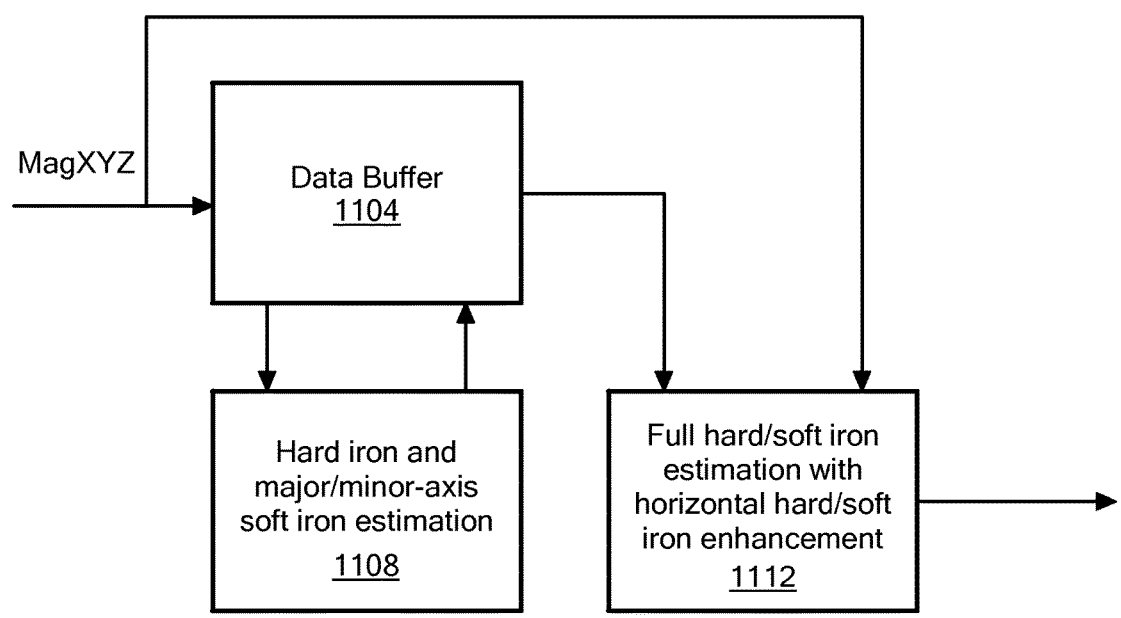
FIG. 11 is a functional block diagram that illustrates the variable structure of calibration mechanization in accordance with an embodiment of the present invention.

In mobile device applications, magnetometer calibration is desired to achieve high accuracy in a very short time period. A full model of hard/soft irons naturally needs more data with good geometry and longer convergence time, so that it may not be good to always start calibration with a full model of hard/soft irons to achieve both fast calibration time and high accuracy. Referring to FIG. 11, a data buffer 1104 stores XYZ magnetometer data that is distributed in 3-D space. A simplified model 1108 for estimating hard irons and max/min axes soft irons is employed initially so that the calibration process can quickly acquire the major errors with a limited number of magnetometer data. Then a full hard/soft-iron model 1112 relays the calibration estimation to refine accuracy. With the buffered magnetometer data, forward and backward processing can be achieved. The buffered XYZ magnetometer data can be backward processed for the full model of soft-iron calibration. Since heading is computed with the horizontal components of Earth's magnetic field, a horizontal hard/soft iron calibration is also incorporated to increase the heading accuracy in level plane. After magnetometer data are calibrated and compensated for hard and soft irons by the Kalman filters, the magnetometer data are transformed into level plane. If there are no hard/soft irons remaining in the horizontal components of Earth's magnetic field, the magnitude of the 2-D horizontal vector of 3-D Earth's magnetic field vector is constant and the trajectory of the 2-D horizontal vector is a circle. However, if there are still hard/soft irons remaining in the horizontal components of Earth's magnetic field vector, the magnitude of the 2-D horizontal magnetic field vector of 3-D Earth's magnetic field vector is not constant and the trajectory of the 2-D horizontal magnetic field vector is an ellipse. The horizontal hard/soft iron calibration is designed to estimate and compensate for the remaining soft and hard irons in the 2-D horizontal magnetic field vector, by estimating the ellipse parameters.

One of ordinary skill in the art will understand that while the above-described embodiments were with respect to earth's magnetic field, the embodiments could be modified to adjust to the magnetic field of a body other than earth if such a system were destined for use there. Such an implementation and use is within the scope of the invention described herein.

Further, the embodiments of the present invention have been described as including the determination of specific values. It is understood that those determinations may be accomplished by a calculation or a calculating step and, therefore, determination and calculation or determining and calculating, as used herein, are representative of the same concepts.

Embodiments of the above-described invention may be implemented in all hardware, or a combination of hardware and software, including program code stored in a firmware format to support dedicated hardware. A software implementation of the above described embodiment(s) may comprise a series of computer instructions either fixed on a tangible medium, such as a computer readable media, e.g., diskette, CD-ROM, ROM, or fixed disk or transmittable to a computer system in a carrier wave, via a modem or other interface device. The medium can be either a tangible medium, including but not limited to optical or analog communications lines, or may be implemented with wireless techniques, including but not limited to radio, microwave, infrared or other transmission techniques. The series of computer instructions whether contained in a tangible medium or a carrier wave embodies all or part of the functionality previously described herein with respect to the embodiments of the present invention. Those skilled in the art will appreciate that such computer instructions can be written in a number of programming languages for use with many computer architectures or operating systems and may exist in machine executable format. It is contemplated that such a computer program product may be distributed as a removable media with accompanying printed or electronic documentation, e.g., shrink-wrapped software, preloaded with a computer system, e.g., on system ROM or fixed disk, or distributed from a server over a network, e.g., the Internet or World Wide Web.

Although various exemplary embodiments of the present invention have been disclosed, it will be apparent to those skilled in the art that changes and modifications can be made which will achieve some of the advantages of the invention without departing from the general concepts of the invention. It will be apparent to those reasonably skilled in the art that other components performing the same functions may be suitably substituted. Further, the methods of the invention may be achieved in either all software implementations, using the appropriate processor instructions, or in hybrid implementations that utilize a combination of hardware logic and software logic to achieve the same results. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A computer-implemented method of fusing data from a three-axis magnetometer and a three-axis accelerometer to provide a magnetic heading of a device, the method comprising:
   receiving, as input, unprocessed magnetic field measurements from the magnetometer associated with the device and unprocessed acceleration measurements from the accelerometer associated with the device;
   filtering the unprocessed magnetic field measurements to remove outlying data points and noise and obtaining filtered magnetic field data;
   applying a first Kalman filter to the filtered magnetic field data to generate first soft iron and hard iron matrices, wherein the first Kalman filter is based on the principle that the magnitude of local Earth's magnetic field vector is constant;
   applying a second Kalman filter to the filtered magnetic field data to generate a coupled soft iron/misalignment correction matrix, wherein the second Kalman filter is based on the principle that an angle between the local Earth's magnetic field vector and the gravitational acceleration vector is constant;
   multiplying the coupled soft iron/misalignment correction matrix by the first soft iron matrix to generate a soft-iron correction matrix;
   filtering the unprocessed acceleration measurements to remove outlying data points and noise and obtaining filtered acceleration measurements;
   correcting the filtered acceleration measurements as a function of one or more error sources and obtaining corrected acceleration measurements;
   correcting the filtered magnetic field data for hard-iron and soft-iron distortions and obtaining corrected magnetic field measurements;
   computing quasi-static roll and pitch angles of the device as a function of the corrected acceleration measurements;
   forming a transformation matrix from a body frame to a level coordinate frame as a function of the computed quasi-static roll and pitch angles;
   transforming the corrected magnetic field measurements from the body frame to the level frame and generating a horizontal magnetic field vector;
   determining a magnetic heading of the device as a function of the generated horizontal magnetic field vector and the generated soft-iron correction matrix;
   providing, to an application operating on the device, the magnetic heading of the device;
   deriving, by the application, angular rates of the device; and
   performing auto-calibration of at least one of: the magnetometer and the accelerometer, based on the corrected acceleration measurements and the derived angular rates.

2. The computer-implemented method of claim 1, further comprising:
   determining when the device is in a quasi-static condition, wherein applying the second Kalman filter to the filtered magnetic field data is performed in response to determining that the device is in a quasi-static condition.

3. The computer-implemented method of claim 1, further comprising:
   determining if a magnetic field disturbance is present.

4. The computer-implemented method of claim 1, further comprising:
   determining if the magnetic field is stable.

5. The computer-implemented method of claim 1, wherein performing auto-calibration of the accelerometer comprises estimating the one or more error sources.

6. The computer-implemented method of claim 1, wherein providing, as output, the magnetic heading of the device comprises providing quasi-static roll, pitch, and magnetic heading information as part of an e-compass application.

7. The computer-implemented method of claim 1, wherein providing, as output, the magnetic heading of the device comprises providing a pseudo nine-axis solution as part of a soft gyroscope function.

8. The computer-implemented method of claim 7, wherein the pseudo nine-axis solution comprises at least one of: dynamic roll angles; dynamic pitch angles; dynamic heading angles; dynamic angular rates; and acceleration determinations.

9. A computer-implemented method of fusing data from a three-axis magnetometer and a three-axis accelerometer to provide a magnetic heading of a device, the method comprising:
receiving unprocessed magnetic field measurements from the magnetometer associated with the device;
receiving unprocessed acceleration measurements from the accelerometer associated with the device;
filtering the unprocessed magnetic field measurements to remove outlying data points and noise and obtaining filtered magnetic field data;
filtering the unprocessed acceleration measurements to remove outlying data points and noise and obtaining filtered acceleration measurements;
correcting the filtered acceleration measurements as a function of one or more error sources and obtaining corrected acceleration measurements;
correcting the filtered magnetic field data for hard-iron and soft-iron distortions and obtaining corrected magnetic field measurements, wherein correcting the filtered magnetic field data for hard-iron and soft-iron distortions comprises applying a first Kalman filter to the filtered magnetic field data and generating first soft iron and hard iron matrices, wherein the first Kalman filter is based on the principle that the magnitude of local Earth's magnetic field vector is constant;
computing quasi-static roll and pitch angles of the device as a function of the corrected acceleration measurements;
forming a transformation matrix from a body frame to a level coordinate frame as a function of the computed quasi-static roll and pitch angles;
transforming the corrected magnetic field measurements from the body frame to the level frame and generating a horizontal magnetic field vector; and
determining a magnetic heading of the device as a function of the generated horizontal magnetic field vector;
providing to an application operating on the device the magnetic heading of the device,
deriving, by the application, angular rates of the device, and
performing auto-calibration of at least one of: the magnetometer and the accelerometer, based on the corrected acceleration measurements and the derived angular rates
the method further comprising:
determining when the device is in a quasi-static condition and, if so determined, then:
applying a second Kalman filter to the filtered magnetic field data and generating a coupled soft iron/misalignment correction matrix, wherein the second Kalman filter is based on the principle that an angle between the local Earth's magnetic field vector and the gravitational acceleration vector is constant; and
multiplying the coupled soft iron/misalignment correction matrix by the first soft iron matrix and generating a soft-iron correction matrix,
wherein the magnetic heading of the device is determined as a function of the generated soft-iron correction matrix.

10. A computer system including a storage device storing computer instructions that, when executed by a computer, implements a method of fusing data from a three-axis magnetometer and a three-axis accelerometer to provide a magnetic heading of a corresponding device, the method comprising:
receiving, as input, unprocessed magnetic field measurements from the magnetometer associated with the device and unprocessed acceleration measurements from the accelerometer associated with the device;
filtering the unprocessed magnetic field measurements to remove outlying data points and noise and obtaining filtered magnetic field data;
applying a first Kalman filter to the filtered magnetic field data to generate first soft iron and hard iron matrices, wherein the first Kalman filter is based on the principle that the magnitude of local Earth's magnetic field vector is constant;
applying a second Kalman filter to the filtered magnetic field data to generate a coupled soft iron/misalignment correction matrix, wherein the second Kalman filter is based on the principle that an angle between the local Earth's magnetic field vector and the gravitational acceleration vector is constant;
multiplying the coupled soft iron/misalignment correction matrix by the first soft iron matrix to generate a soft-iron correction matrix;
filtering the unprocessed acceleration measurements to remove outlying data points and noise and obtaining filtered acceleration measurements;
correcting the filtered acceleration measurements as a function of one or more error sources and obtaining corrected acceleration measurements;
correcting the filtered magnetic field data for hard-iron and soft-iron distortions and obtaining corrected magnetic field measurements;
computing quasi-static roll and pitch angles of the device as a function of the corrected acceleration measurements;
forming a transformation matrix from a body frame to a level coordinate frame as a function of the computed quasi-static roll and pitch angles;
transforming the corrected magnetic field measurements from the body frame to the level frame and generating a horizontal magnetic field vector;
determining a magnetic heading of the device as a function of the generated horizontal magnetic field vector and the generated soft-iron correction matrix; and
providing, to an application operating on the device, the magnetic heading of the device;
deriving, by the application, angular rates of the device; and
performing auto-calibration of at least one of: the magnetometer and the accelerometer, based on the corrected acceleration measurements and the derived angular rates.

11. The computer system of claim 10, wherein the method further comprises:
   determining when the device is in a quasi-static condition, wherein applying the second Kalman filter to the filtered magnetic field data is performed in response to determining that the device is in a quasi-static condition.

12. The computer system of claim 10, wherein the method further comprises:
   determining if a magnetic field disturbance is present.

13. The computer system of claim 10, wherein the method further comprises:
   determining if the magnetic field is stable.

14. The computer system of claim 10, wherein performing auto-calibration of the accelerometer comprises estimating the one or more error sources.

15. The computer system of claim 10, wherein providing, as output, the magnetic heading of the device comprises providing quasi-static roll, pitch, and magnetic heading information as part of an e-compass application.

16. The computer system of claim 10, wherein providing, as output, the magnetic heading of the device comprises providing a pseudo nine-axis solution as part of a soft gyroscope function.

17. The computer system of claim 16, wherein the pseudo nine-axis solution comprises at least one of: dynamic roll angles; dynamic pitch angles; dynamic heading angles; dynamic angular rates; and acceleration determinations.

* * * * *